United States Patent
Wu et al.

(10) Patent No.: US 9,443,955 B2
(45) Date of Patent: Sep. 13, 2016

(54) SEMICONDUCTOR DEVICE AND METHOD FOR FABRICATING THE SAME

(71) Applicant: MACRONIX International Co., Ltd., Hsinchu (TW)

(72) Inventors: Guan-Wei Wu, Hsinchu (TW); Yao-Wen Chang, Hsinchu (TW); I-Chen Yang, Hsinchu (TW); Tao-Cheng Lu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/539,768

(22) Filed: Nov. 12, 2014

(65) Prior Publication Data
US 2016/0133718 A1    May 12, 2016

(51) Int. Cl.
*H01L 29/66* (2006.01)

(52) U.S. Cl.
CPC ..... *H01L 29/6656* (2013.01); *H01L 29/66575* (2013.01)

(58) Field of Classification Search
CPC ................ H01L 29/66537; H01L 29/6656
USPC ........................................ 438/519, 527, 528
See application file for complete search history.

(56) References Cited

U.S. PATENT DOCUMENTS

| | | | | |
|---|---|---|---|---|
| 6,329,225 B1 * | 12/2001 | Rodder | ............ | H01L 21/28518 257/327 |
| 6,927,460 B1 * | 8/2005 | Leibiger | ........... | H01L 21/82348 257/272 |
| 2005/0054173 A1 * | 3/2005 | Wang | ................ | H01L 21/26513 438/369 |

* cited by examiner

*Primary Examiner* — Kimberly Rizkallah
*Assistant Examiner* — Maria Ligai
(74) *Attorney, Agent, or Firm* — J.C. Patents (57) ABSTRACT

Provided is a semiconductor device. Two stack layers are disposed on a substrate of a first conductivity type. Each of stack layers includes a dielectric layer and a conductive layer. The dielectric layer is disposed on the substrate. The conductive layer is disposed on the dielectric layer. First doped region of a second conductivity type has a first dopant and is disposed in the substrate between the stack layers. A pre-amorphization implantation (PAI) region is disposed in the first doped region. A second doped region of the second conductivity type has a second dopant and is disposed in the PAI region. The first conductivity type is different from the second conductivity type. A diffusion rate of the second dopant is faster than a diffusion rate of the first dopant, and a thermal activation of the second dopant is higher than that of the first dopant.

17 Claims, 6 Drawing Sheets

SEMICONDUCTOR DEVICE AND METHOD FOR FABRICATING THE SAME

BACKGROUND OF THE INVENTION

1. Field of the Invention

The invention relates to an electronic device and a method of fabricating the same, and more particularly, the invention relates to a semiconductor device and a method of fabricating the same.

2. Description of Related Art

As the integration of semiconductor devices continues to improve and their sizes continue to decrease, it becomes more and more difficult to achieve the desired punch-through voltage (Vpt) to breakdown voltage (Vbd) correlation. In other words, the punch-through voltage and the breakdown voltage are reduced as the sizes of the semiconductor devices decrease, which affects the reliability of the semiconductor devices. For this reason, in the miniaturized semiconductor fabrication, it is a great challenge to form the source region or drain region. Thus, how to improve the punch-through voltage and the breakdown voltage of the semiconductor devices while maintaining a resistance value of the source region or the drain region of the semiconductor devices is an important issue in this field.

SUMMARY OF THE INVENTION

The invention provides a semiconductor device and a method of fabricating the same, which significantly improve a punch-through voltage and a breakdown voltage.

The invention provides a semiconductor device and a method of fabricating the same, which optimize a source junction and a drain junction.

The invention provides a semiconductor device and a method of fabricating the same, which are applicable to a charge trapping non-volatile memory device.

The invention provides a semiconductor device, including: a substrate of a first conductivity type, two stack layers, a first doped region of a second conductivity type, a pre-amorphization implantation (PAI) region, and a second doped region of the second conductivity type. The two stack layers are disposed on the substrate, and each of the stack layers includes a dielectric layer and a conductive layer. The dielectric layer is disposed on the substrate. The conductive layer is disposed on the dielectric layer. The first doped region has a first dopant therein and is disposed in the substrate between the stack layers. The PAI region is disposed in the first doped region. The second doped region has a second dopant and is disposed in the PAI region. The first conductivity type is different from the second conductivity type. A diffusion rate of the second dopant is faster than a diffusion rate of the first dopant. Besides, a thermal activation of the second dopant is higher than a thermal activation of the first dopant.

In an embodiment of the invention, the semiconductor device further includes a third doped region of the second conductivity type, which is disposed in the substrate under the first doped region.

In an embodiment of the invention, the third doped region includes two or more doped regions.

In an embodiment of the invention, the first dopant includes arsenic or antimony.

In an embodiment of the invention, the second dopant is phosphorus.

In an embodiment of the invention, the PAI region includes atoms, ions, or molecules of carbon, germanium, or a Group IV element therein.

The invention provides a fabricating method for fabricating a semiconductor device. The fabricating method includes the following. A substrate of a first conductivity type is provided. Two stack layers are formed on the substrate, and each of the stack layers includes a dielectric layer disposed on the substrate. A conductive layer is disposed on the dielectric layer. A first doped region of a second conductivity type is formed in the substrate between the stack layers, wherein the first doped region has a first dopant. A pre-amorphization implantation process is performed to form a PAI region in the first doped region. A first spacer is formed respectively on a sidewall of each of the stack layers. The first spacer is used as a mask to implant a second dopant, so as to form a second doped region of the second conductivity type in the PAI region, wherein the first conductivity type is different from the second conductivity type, a diffusion rate of the second dopant is faster than a diffusion rate of the first dopant, and a thermal activation of the second dopant is higher than a thermal activation of the first dopant.

In an embodiment of the invention, a forming method of the PAI region includes forming a second spacer respectively on the sidewall of each of the stack layers. The second spacer is used as a mask for performing a pre-amorphization implantation process, so as to form the PAI region in the first doped region.

In an embodiment of the invention, the pre-amorphization implantation process is performed after formation of the first spacer. A step of the pre-amorphization implantation process includes performing a tilted ion implantation process with the first spacer as a mask.

In an embodiment of the invention, a tilted angle of the tilted ion implantation process is in a range of 10 degrees to 15 degrees.

In an embodiment of the invention, the pre-amorphization implantation process is performed after formation of the first spacer and the second doped region; and before performing the pre-amorphization implantation process, the fabricating method further includes performing a first etching process on the first spacer to form the second spacer. The pre-amorphization implantation process is performed with the second spacer as a mask. A second etching process is performed on the second spacer to expose the sidewall of each of the stack layers. The first doped region is formed in the substrate between the stack layers with the stack layers as masks.

In an embodiment of the invention, the fabricating method further includes forming a third doped region of the second conductivity type in the substrate under the first doped region.

In an embodiment of the invention, the third doped region includes two or more doped regions.

In an embodiment of the invention, forming the PAI region includes performing the pre-amorphization implantation process at a temperature between −80° C. and −100° C.

In an embodiment of the invention, the first dopant includes arsenic.

In an embodiment of the invention, the second dopant includes phosphorus.

In an embodiment of the invention, the PAI region includes atoms, ions, or molecules of carbon, germanium, or a Group IV element therein.

Based on the above, the embodiment of the invention utilizes several ion implantation processes to surround the highly-active dopant that diffuses easily (e.g., phosphorus) with the PAI region and the dopant that does not diffuse easily (e.g., arsenic), so as to prevent the highly-active dopant from diffusing into the substrate. Accordingly, the junction of the implanted region is optimized to improve the punch-through voltage and the breakdown voltage of the semiconductor device.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

In the following embodiments, if a first conductivity type is N-type, a second conductivity type is P-type; or if the first conductivity type is P-type, the second conductivity type is N-type. In this embodiment as illustrated, the first conductivity type is P-type and the second conductivity type is N-type, for example. However, it should be noted that the invention is not limited thereto. A P-type dopant is boron, for example. An N-type dopant is phosphorous or arsenic, for example.

A semiconductor device described in the following embodiments is a charge trapping non-volatile memory device, for example. However, it should be noted that the invention is not limited thereto.

Figure 1A:
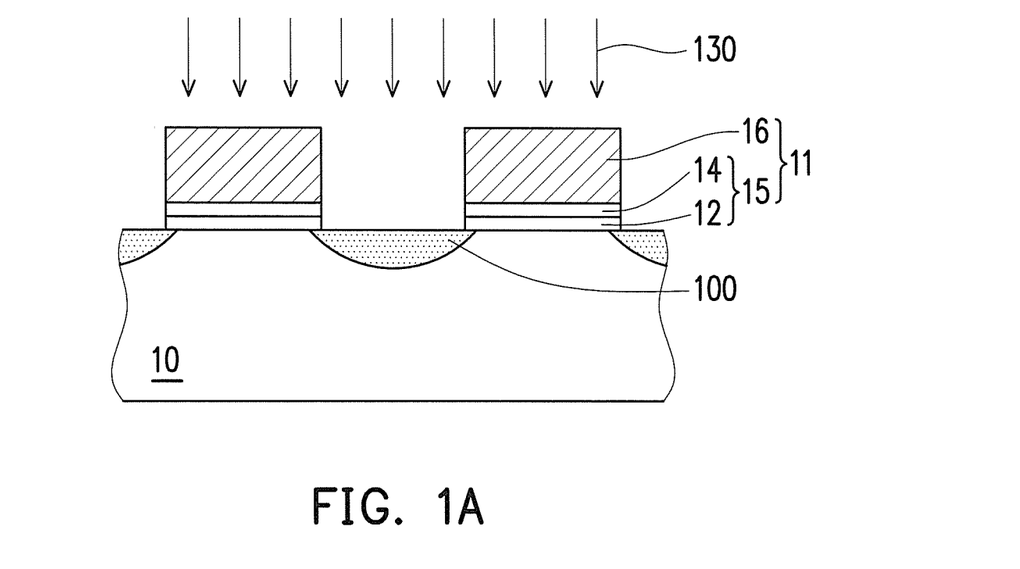
FIG. 1A to FIG. 1C are schematic cross-sectional views illustrating a fabricating process of a semiconductor device according to the first embodiment of the invention.
Figure 1B:
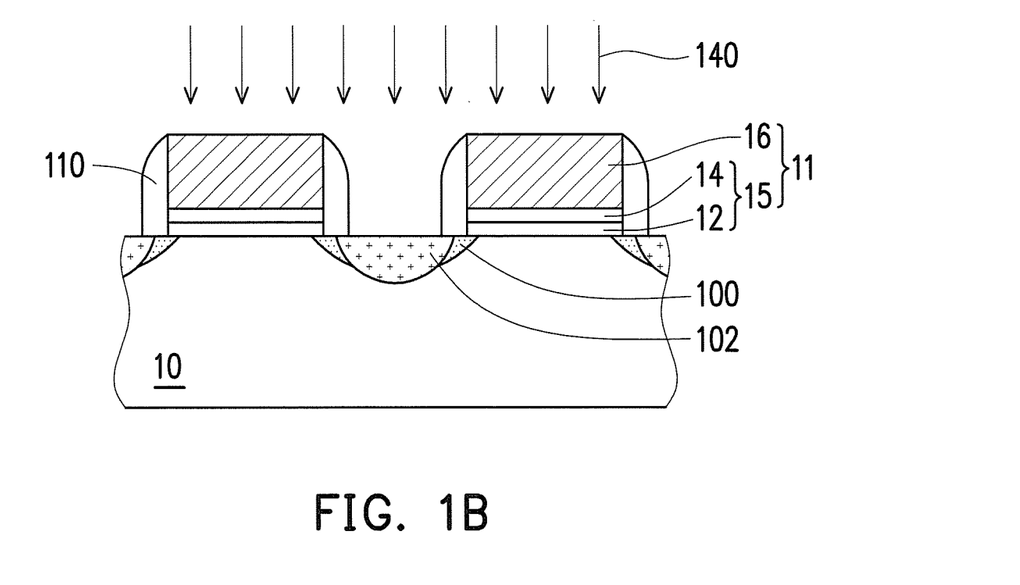
Figure 1C:
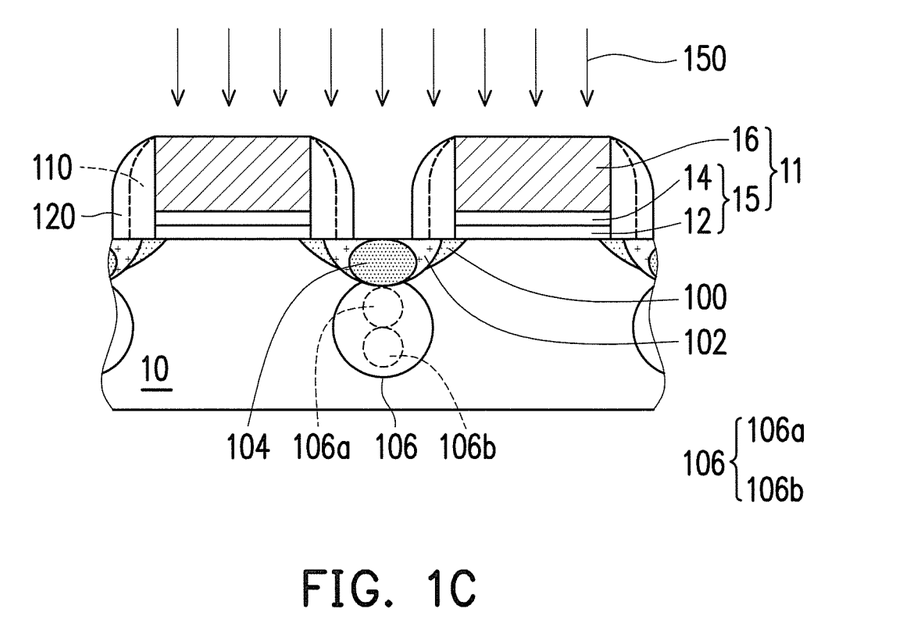

FIG. 1A to FIG. 1C are schematic cross-sectional views illustrating a fabricating process of a semiconductor device according to the first embodiment of the invention.

Referring to FIG. 1A, a substrate 10 is provided. A material of the substrate 10 is a semiconductor substrate of the first conductivity type, e.g., a P-type substrate, for example. A material of the semiconductor substrate is at least one selected from a group consisting of Si, Ge, SiGe, GaP, GaAs, SiC, SiGeC, InAs, and InP, for example. The substrate 10 may also be a silicon on insulator (SOI) substrate.

Next, a plurality of stack layers 11 is formed on the substrate 10. Each of the stack layers 11 includes a dielectric layer 15 and a conductive layer 16, for example. A method of forming the stack layer 11 includes forming a dielectric material layer and a conductive material layer in sequence first, for example. Then, a photolithographic and etching process is carried out. In an embodiment, the dielectric layer 15 serves as a gate dielectric layer and the conductive layer 16 serves as a gate. A material of the dielectric layer 15 is silicon oxide, silicon oxynitride, or a high dielectric constant material, for example. The high dielectric constant material is a dielectric material having a dielectric constant greater than 4, such as HfAlO, HfO$_2$, Al$_2$O$_3$, or Si$_3$N$_4$, for example. In another embodiment, the dielectric layer 15 includes a tunneling dielectric layer 12 and a charge storage layer 14. The conductive layer 16 serves as a control gate, for example. The tunneling dielectric layer 12 may be composed of a single-material layer. The single-material layer is a low dielectric constant material or a high dielectric constant material, for example. The low dielectric constant material is a dielectric material having a dielectric constant smaller than 4, such as silicon oxide or silicon oxynitride, for example. The high dielectric constant material is a dielectric material having a dielectric constant greater than 4, such as HfAlO, HfO$_2$, Al$_2$O$_3$, or Si$_3$N$_4$, for example. The tunneling dielectric layer 12 may also be composed of a two-layer or multiple-layer material layer. Nevertheless, the invention is not limited thereto. A forming method thereof may be chemical vapor deposition, thermal oxidation, etc. The charge storage layer 14 may be composed of a single-material layer, a two-layer or multiple-layer material layer. A material of the charge storage layer 14 may include a high dielectric constant material, such as nitride, for example. In an embodiment, the tunneling dielectric layer 12 and the charge storage layer 14 are together composed of oxide-nitride-oxide layer. A material of the conductive layer 16 may be doped polysilicon, undoped polysilicon, or a combination thereof, for example. A forming method thereof may be chemical vapor deposition.

Then, an ion implantation process 130 is performed to form a doped region 100 of the second conductivity type in the substrate 10 between the stack layers 11. The doped region 100 has a first dopant therein. In an embodiment, the substrate 10 is the first conductivity type; and the doped region 100 is the second conductivity type. The first conductivity type is P-type while the second conductivity type is N-type, for example, and vice versa. In an embodiment, the first dopant implanted in the doped region 100 is arsenic or antimony, a dopant dose is $1.0 \times 10^{14}/cm^2$ to $2.5 \times 10^{14}/cm^2$, and implanted energy is 5 keV to 7 keV, for example.

Referring to FIG. 1B, a spacer 110 is formed respectively on a sidewall of each of the stack layers 11. A forming method of the spacer 110 includes forming a spacer material layer (not shown) on the substrate 10 to cover a top surface and the sidewall of each of the stack layers 11 by chemical vapor deposition, for example. Thereafter, anisotropic etching is performed on the spacer material layer to expose the top surface of each of the stack layers 11, so as to form the spacer 110 on the sidewall of each of the stack layers 11. The thickness of the spacer 110 may determine a doping range of a pre-amorphization implantation (PAI) region 102 in the subsequent processes. In an embodiment, the thickness of the spacer 110 ranges from 20 angstroms to 30 angstroms. In an embodiment, the spacer material layer includes SiO, SiN, SiON, SiC, SiCN, or a combination thereof. However, the material of the spacer material layer is not limited to the above. Any material may be used as the spacer material layer in the invention as long as it has high etching selectivity with respect to the stack layers 11 and the substrate 10.

Then, the PAI region 102 is formed in the doped region 100. More specifically, using the spacer 110 as a mask, a pre-amorphization implantation process 140 is performed to the substrate 10 of the doped region 100, for example, so as to damage a single crystal structure in the substrate 10 to form an amorphous structure. Next, a heat treatment is performed to recrystallize the amorphous structure, so as to form the PAI region 102 in the doped region 100. The aforementioned pre-amorphization implantation process may be a cryogenic ion implantation. The cryogenic ion implantation may be carried out at a temperature lower than −80° C., such that the substrate 10 is not damaged easily. In an embodiment, the cryogenic ion implantation is carried out at a temperature between −80° C. and −100° C. The PAI region 102 includes atoms, ions, or molecules of carbon, germanium, or a Group IV element therein, a dopant dose is $1.0 \times 10^{15}/cm^2$ to $2.5 \times 10^{15}/cm^2$, and implanted energy is 5 keV to 7 keV, for example.

Referring to FIG. 1C, in an embodiment, a spacer 120 is formed on a sidewall of the spacer 110. The thicknesses of the spacers 110 and 120 may determine a doping range of a doped region 104 in the subsequent processes. A material of the spacer material layer includes SiO, SiN, SiON, SiC, SiCN, or a combination thereof. However, the material of the spacer material layer is not limited to the above. Any material may be used as the spacer material layer in the invention as long as it has high etching selectivity with respect to the stack layers 11 and the substrate 10.

In another embodiment, the spacer 110 may be removed before the formation of the spacer 120. Thereafter, the spacer 120 may be respectively formed on the sidewall of each of the stack layers 11. A method of removing the spacer 110 is dry etching or wet etching, for example. The thickness of the spacer 120 may determine the doping range of the doped region 104 in the subsequent processes. In an embodiment, the thickness of the spacer 120 is greater than the thickness of the spacer 110. In an exemplary embodiment, the thickness of the spacer 120 ranges from 70 angstroms to 100 angstroms. A forming method of the spacer 120 is similar to the forming method of the spacer 110, and thus no further description is provided here.

Then, using the spacer 120 as a mask, an ion implantation process 150 is performed for implanting a second dopant, so as to form the doped region 104 of the second conductivity type in the PAI region 102 (to serve as a source or a drain, for example). The first conductivity type is different from the second conductivity type. A diffusion rate of the second dopant is faster than a diffusion rate of the first dopant. A thermal activation of the second dopant is higher than a thermal activation of the first dopant. The second dopant having higher thermal activation can lead to a lower resistance. In an embodiment, the second dopant implanted in the doped region 104 is phosphorus or, a dopant dose is $1.0 \times 10^{15}/cm^2$ to $1.5 \times 10^{15}/cm^2$, and implanted energy is 5 keV to 6 keV, for example.

According to the embodiment of the invention, the PAI region 102 is used to surround the doped region 104 that has the highly-active second dopant (e.g., phosphorus or), such that the highly-active second dopant does not easily diffuse into the substrate 10, so as to maintain a resistance value of a predetermined implanted region thereof (e.g., source region/drain region). In this embodiment, the first dopant (e.g., arsenic or antimony) is used to surround the PAI region 102 and that can relax the junction field resulted from pocked implant dopant (e.g., boron) tend to gather at the boundary of the PAI region 102. Accordingly, this embodiment optimizes the junction of PAI region 102, thereby improving the punch-through voltage and the breakdown voltage of the semiconductor device of the invention.

It should be noted that the fabricating process of the semiconductor device of this embodiment further includes using the spacer 120 as a mask to perform an ion implantation process, so as to form a doped region 106 of the second conductivity type in the substrate 10 under the doped region 100. The doped region 106 provides an effect of an isolation structure for preventing electrical disturbance between the stack layers 11. In an embodiment, the doped region 106 may include two or more doped regions. For example, the doped region 106 includes two doped regions 106a and 106b, and an implanted dopant thereof is arsenic or phosphorus, for example. A dopant dose for the doped region 106a is $1.0 \times 10^{14}/cm^2$ to $1.5 \times 10^{14}/cm^2$, and the implanted energy is 30 keV to 40 keV, for example. A dopant dose for the doped region 106b is $2.0 \times 10^{13}/cm^2$ to $3.0 \times 10^{13}/cm^2$, and the implanted energy is 50 keV to 70 keV, for example. The doped region 106 may be formed after the formation of the doped region 104 or before the formation of the doped region 104.

Figure 2A:
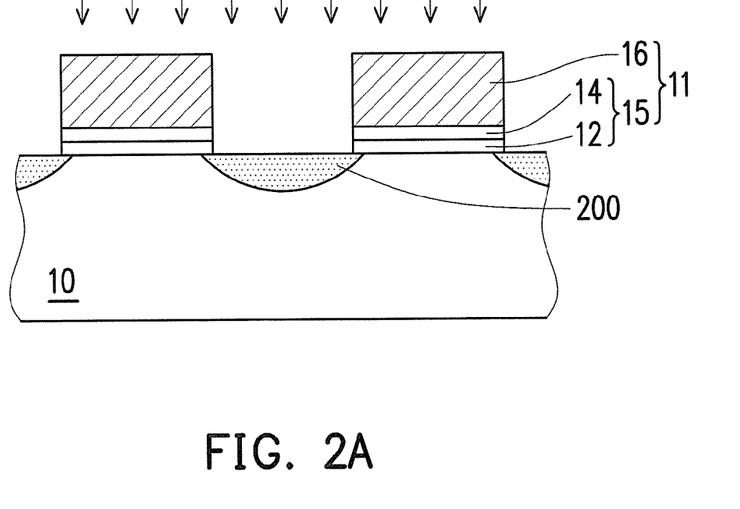
FIG. 2A to FIG. 2B are schematic cross-sectional views illustrating a fabricating process of a semiconductor device according to the second embodiment of the invention.
Figure 2B:
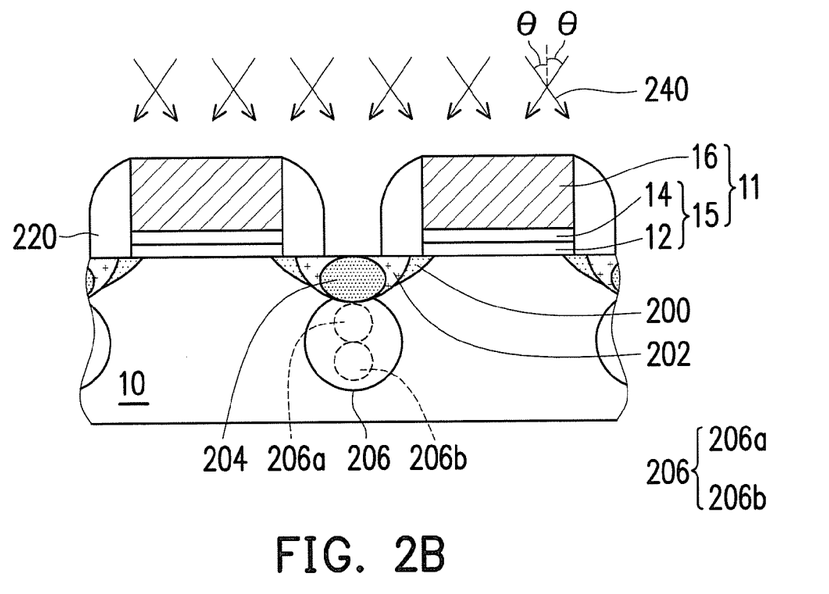

FIG. 2A to FIG. 2B are schematic cross-sectional views illustrating a fabricating process of a semiconductor device according to the second embodiment of the invention.

Referring to FIG. 2A, a plurality of stack layers 11 are formed on the substrate 10 according to the aforementioned method. Then, an ion implantation process 230 is performed to form a doped region 200 of the second conductivity type in the substrate 10 between the stack layers 11. A forming method of the doped region 200 and a dopant for the doped region 200 may be the same as those of the doped region 100.

Referring to FIG. 2B, a spacer 220 is formed respectively on a sidewall of each of the stack layers 11. The material, thickness, and forming method of the spacer 220 may be the same as those of the spacer 120, and thus no further description is provided here.

Next, a pre-amorphization implantation process 240 is performed with the spacer 220 as a mask, so as to form a PAI region 202 in the doped region 200. What distinguishes the second embodiment from the first embodiment is that: in the second embodiment, the pre-amorphization implantation process is a tilted ion implantation process, for example. A tilted angle θ of the tilted ion implantation process may be defined as an angle between an incident direction of implanted ions and a normal direction (perpendicular to a surface of the substrate 10) of the surface of the substrate 10. In an embodiment, the tilted angle θ of the tilted ion implantation process is in a range of 10 degrees to 15 degrees. Because the pre-amorphization implantation process of the second embodiment is the tilted ion implantation process, a predetermined implanted doping range of the PAI region 202 may extend into the substrate 10 under the spacer 220. In an embodiment, the pre-amorphization implantation process may be a tilted cryogenic ion implantation. The tilted cryogenic ion implantation may be carried out at a temperature lower than −80° C., such that the substrate 10 is not damaged easily. In an exemplary embodiment, the tilted cryogenic ion implantation is carried out at a temperature between −80° C. and −100° C., and the tilted angle θ is in a range of 10 degrees to 15 degrees. In an embodiment, the PAI region 202 includes atoms, ions, or molecules of carbon, germanium, or a Group IV element therein, a dopant dose is $1.0 \times 10^{15}/cm^2$ to $2.5 \times 10^{15}/cm^2$, and implanted energy is 5 keV to 7 keV, for example.

Then, using the spacer 220 as a mask, an ion implantation is performed to implant the second dopant, so as to form a doped region 204 of the second conductivity type in the PAI region 202 (to serve as a source or a drain, for example). Thereafter, another ion implantation is performed by using the spacer 220 as a mask to form a doped region 206 in the substrate 10 under the doped region 200. In an embodiment, the doped region 206 may include two doped regions 206a and 206b or more. The implanted dopant, forming method, and implanted energy of the doped regions 204 and 206 are the same as those of the doped regions 104 and 106 and have been specified above. Thus, no further description is provided here.

FIG. 3A to FIG. 3E are schematic cross-sectional views illustrating a fabricating process of a semiconductor device according to the third embodiment of the invention.

Figure 3A:
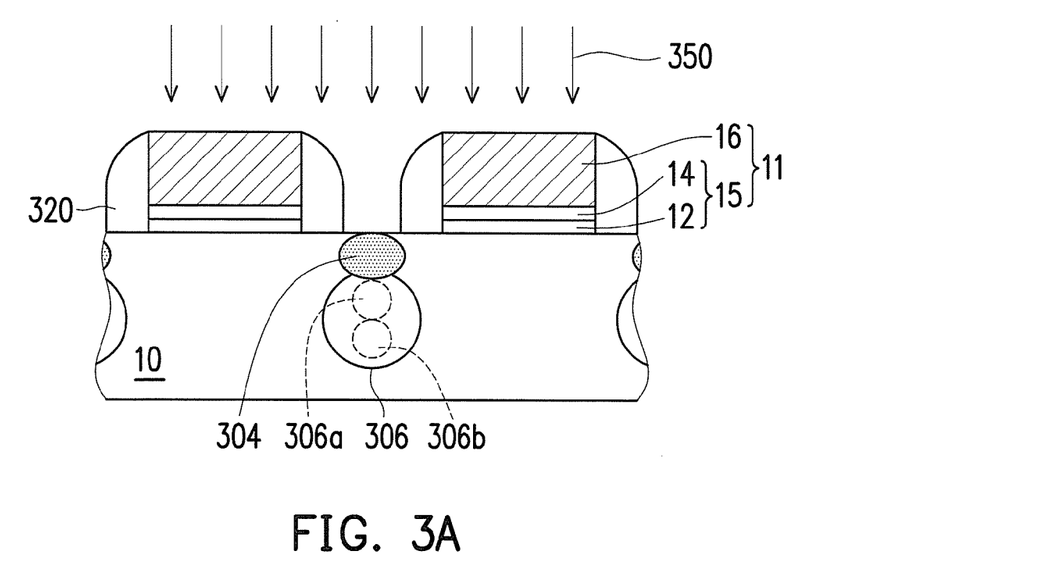
FIG. 3A to FIG. 3E are schematic cross-sectional views illustrating a fabricating process of a semiconductor device according to the third embodiment of the invention.

Referring to FIG. 3A, a plurality of stack layers 11 are formed on the substrate 10 according to the aforementioned method.

Then, a spacer 320 is formed respectively on the sidewall of each of the stack layers 11. The material, thickness, and forming method of the spacer 320 may be the same as those of the spacer 120, and thus no further description is provided here.

Thereafter, using the spacer 320 as a mask, an ion implantation process 350 is performed for implanting the second dopant, so as to form a doped region 304 of the second conductivity type in the substrate 10 (to serve as a source or a drain, for example). Then, a doped region 306 is formed in the substrate 10 under the doped region 304 by using the spacer 320 as a mask. In an embodiment, the doped region 306 may include two doped regions 306a and 306b or more. The implanted dopant, forming method, and implanted energy of the doped regions 304 and 306 are the same as those of the doped regions 104 and 106 and have been specified above. Thus, no further description is provided here.

Figure 3B:
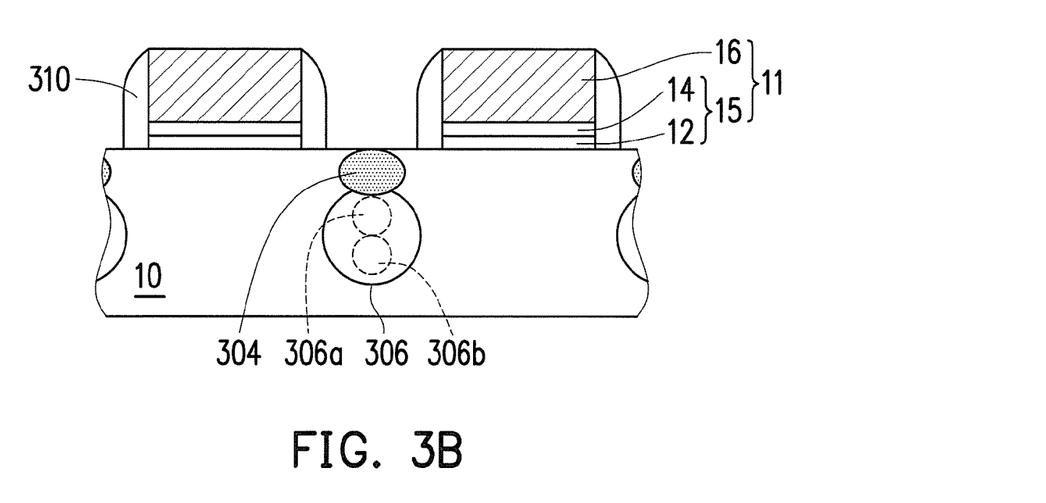
Figure 3C:
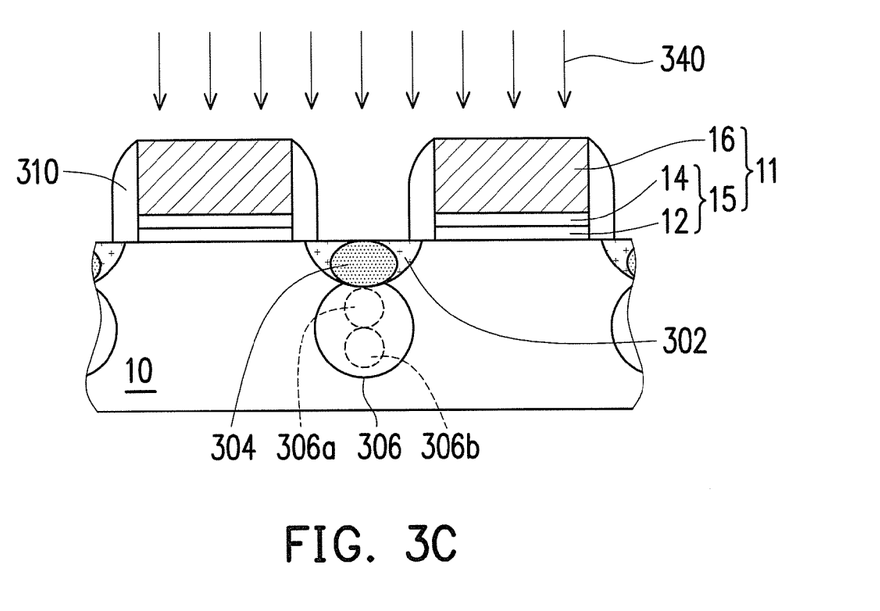

Referring to FIG. 3B, after forming the doped region 304, a first etching process is performed on the spacer 320 to reduce the thickness of the spacer 320, so as to form a spacer 310. In an embodiment, the thickness of the spacer 310 may range from 20 angstroms to 30 angstroms and may determine a doping range of a pre-amorphization implantation (PAI) region 302 in the subsequent processes (FIG. 3C). The first etching process is an etching back process, for example. In an embodiment, the etching back process is an anisotropic etching process, for example.

Next, referring to FIG. 3C, using the spacer 310 as a mask, a pre-amorphization implantation process 340 is performed, so as to form the PAI region 302 in the substrate 10 above the doped region 306. The PAI region 302 surrounds the doped region 304 for preventing the second dopant of the doped region 304 from diffusing into the substrate 10. The pre-amorphization implantation process may be a cryogenic ion implantation. The cryogenic ion implantation may be carried out at a temperature lower than −80° C., such that the substrate 10 is not damaged easily. In an exemplary embodiment, the cryogenic ion implantation is carried out at a temperature between −80° C. and −100° C. In an embodiment, the PAI region 302 includes atoms, ions, or molecules of carbon, germanium, or a Group IV element, a dopant dose is $1.0 \times 10^{15}/cm^2$ to $2.5 \times 10^{15}/cm^2$, and implanted energy is 5 keV to 7 keV, for example.

Figure 3D:
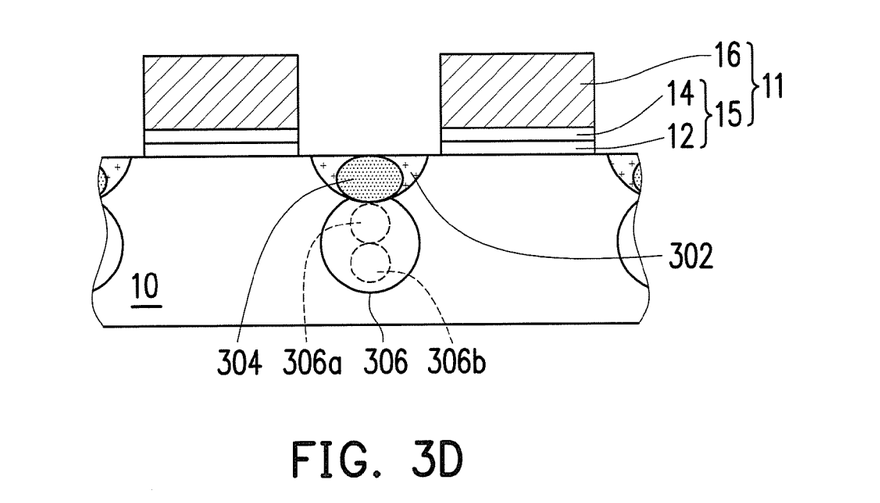

Referring to FIG. 3D, a second etching process is performed on the spacer 310 to remove the spacer 310, so as to expose the sidewall of each of the stack layers 11. The second etching process is an etching back process, for example. In an embodiment, the etching back process is an anisotropic etching process, for example.

Figure 3E:
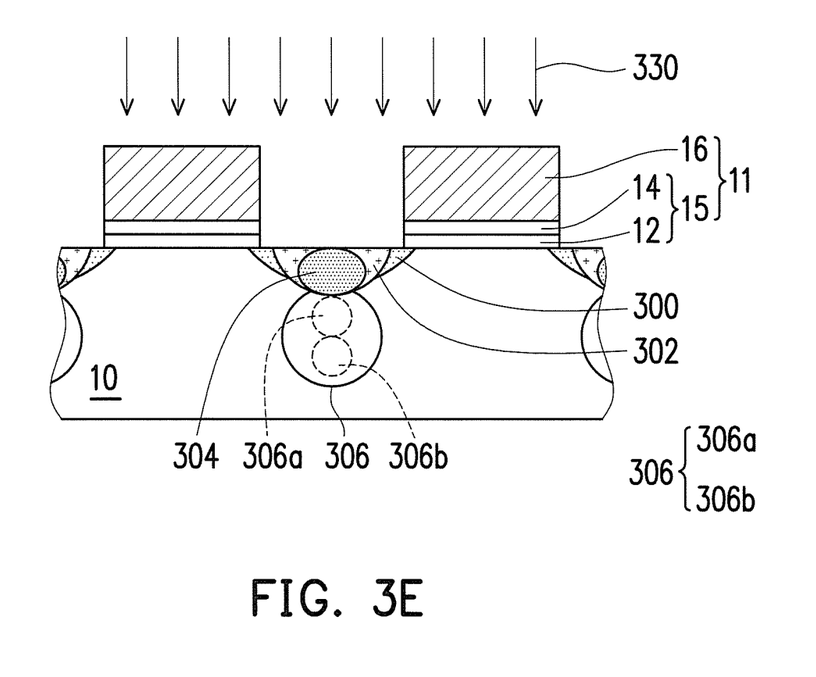

Next, referring to FIG. 3E, an ion implantation process 330 is performed with the stack layers 11 as masks, so as to form a doped region 300 of the second conductivity type in the substrate 10 between the stack layers 11. The doped region 300 surrounds the PAI region 302, and the PAI region 302 surrounds the doped region 304, thereby preventing the second dopant of the doped region 304 from diffusing into the substrate 10. The implanted dopant, forming method, and implanted energy of the doped region 300 are the same as those of the doped region 100 and have been specified above. Thus, no further description is provided here.

Referring to FIG. 3E, the semiconductor device of the third embodiment of the invention includes the substrate 10 of the first conductivity type, two stack layers 11, the doped region 300 of the second conductivity type, the PAI region 302, the doped region 304 of the second conductivity type, and the doped region 306 of the second conductivity type. The first conductivity type is different from the second conductivity type. The two stack layers 11 are disposed on the substrate 10, and each of the stack layers 11 includes a dielectric layer 15 and a conductive layer 16 on the dielectric layer 15. The doped region 300 has the first dopant therein and is disposed in the substrate 10 between the stack layers 11. The PAI region 302 is disposed in the doped region 300. The doped region 304 has the second dopant therein and is disposed in the PAI region 302. The diffusion rate of the second dopant is faster than the diffusion rate of the first dopant. The doped region 306 is disposed in the substrate 10 under the doped region 300. The doped region 306 includes two doped regions 306a and 306b or more doped regions.

In conclusion, the semiconductor device of the embodiments of the invention includes two doped regions and the PAI region disposed between the two stack layers. The two doped regions have the same conductivity type and include the doped region with a greater width and the doped region with a smaller width. The doped region with the smaller width is located in the doped region with the greater width. The doped region with the greater width has the first dopant (e.g., arsenic or antimony) that has the slower diffusion rate. The doped region with the smaller width has the second dopant (e.g., phosphorus) that is highly active and diffuses easily. The PAI region includes the dopant (e.g., carbon or germanium) that does not diffuse easily and is located around the doped region with the smaller width. Since the dopant (e.g., carbon or germanium), which does not diffuse easily and can suppress the diffusion of phosphorous, of the PAI region is used to surround the second dopant (e.g., phosphorus), which is highly thermal active and diffuses easily, of the doped region with the smaller width, the highly-active second dopant does not easily diffuse into the substrate, so as to maintain the resistance value of the predetermined implanted region thereof (e.g., source region/drain region). The doped region with the greater width is located around the PAI region. Since the first dopant (e.g., arsenic or antimony) of the doped region with the greater width is used to surround the PAI region and that can relax the junction field resulted from pocked implant dopant (e.g., boron) tend to gather at the boundary of PAI region, so as to reduce the breakdown voltage of the junction. Accordingly, the invention utilizes several ion implantation processes to prevent the highly-active second dopant from diffusing into the substrate and at the same time optimize the junction of the PAI region, thereby improving the punch-through voltage and the breakdown voltage of the semiconductor device of the invention.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A semiconductor device, comprising:
   two stack layers disposed on a substrate of a first conductivity type, wherein each of the stack layers comprises:
   a dielectric layer disposed on the substrate; and
   a conductive layer disposed on the dielectric layer;
   a first doped region of a second conductivity type, the first doped region comprising a first dopant therein and being disposed in the substrate between the stack layers;
   a pre-amorphization implantation (PAI) region disposed in the first doped region, wherein the PAI region is completely inside of the first doped region; and
   a second doped region of the second conductivity type, the second doped region comprising a second dopant therein and being disposed in the PAI region, wherein the second doped region is completely inside of the PAI region, the first conductivity type is different from the second conductivity type, a diffusion rate of the second dopant is faster than a diffusion rate of the first dopant, and a thermal activation of the second dopant is higher than a thermal activation of the first dopant.

2. The semiconductor device according to claim 1, further comprising a third doped region of the second conductivity type, the third doped region disposed in the substrate under the first doped region.

3. The semiconductor device according to claim 2, wherein the third doped region comprises two or more doped regions.

4. The semiconductor device according to claim 1, wherein the first dopant comprises arsenic or antimony.

5. The semiconductor device according to claim 1, wherein the second dopant comprises phosphorus.

6. The semiconductor device according to claim 1, wherein the PAI region comprises atoms, ions, or molecules of carbon, germanium, or a Group IV element therein.

7. A fabricating method for fabricating a semiconductor device, the fabricating method comprising:
   providing a substrate of a first conductivity type;
   forming two stack layers on the substrate, wherein each of the stack layers comprises:
   a dielectric layer disposed on the substrate; and
   a conductive layer disposed on the dielectric layer;
   forming a first doped region of a second conductivity type in the substrate between the stack layers, wherein the first doped region comprises a first dopant therein;
   performing a pre-amorphization implantation process to form a pre-amorphization implantation (PAI) region in the first doped region, wherein the PAI region is completely inside of the first doped region;
   forming a first spacer on a sidewall of each of the stack layers; and
   implanting a second dopant with the first spacer as a mask to form a second doped region of the second conductivity type in the PAI region, wherein the second doped region is completely inside of the PAI region,
   wherein the first conductivity type is different from the second conductivity type, and a diffusion rate of the second dopant is faster than a diffusion rate of the first dopant, and a thermal activation of the second dopant is higher than a thermal activation of the first dopant.

8. The fabricating method according to claim 7, wherein a forming method of the PAI region comprises:
   forming a second spacer respectively on the sidewall of each of the stack layers; and
   performing the pre-amorphization implantation process with the second spacer as a mask to form the PAI region in the first doped region.

9. The fabricating method according to claim 7, wherein the pre-amorphization implantation process is performed after formation of the first spacer, and a step of the pre-amorphization implantation process comprises performing a tilted ion implantation process with the first spacer as a mask.

10. The fabricating method according to claim 9, wherein a tilted angle of the tilted ion implantation process is in a range of 10 degrees to 15 degrees.

11. The fabricating method according to claim 7, wherein the pre-amorphization implantation process is performed after formation of the first spacer and the second doped region, and
   before performing the pre-amorphization implantation process, the fabricating method further comprises performing a first etching process on the first spacer to form a second spacer;
   performing the pre-amorphization implantation process with the second spacer as a mask;
   performing a second etching process on the second spacer to expose the sidewall of each of the stack layers; and
   forming the first doped region in the substrate between the stack layers with the stack layers as masks.

12. The fabricating method according to claim 7, further comprising forming a third doped region of the second conductivity type in the substrate under the first doped region.

13. The fabricating method according to claim 12, wherein the third doped region comprises two or more doped regions.

14. The fabricating method according to claim 7, wherein forming the PAI region comprises performing the pre-amorphization implantation process at a temperature between −80° C. and −100° C.

15. The fabricating method according to claim 7, wherein the first dopant comprises arsenic or antimony.

16. The fabricating method according to claim 7, wherein the second dopant comprises phosphorus.

17. The fabricating method according to claim 7, wherein the PAI region comprises atoms, ions, or molecules of carbon, germanium, or a Group IV element therein.

* * * * *